(12) United States Patent
Weingarten et al.

(10) Patent No.: US 8,508,995 B2
(45) Date of Patent: Aug. 13, 2013

(54) SYSTEM AND METHOD FOR ADJUSTING READ VOLTAGE THRESHOLDS IN MEMORIES

(75) Inventors: Hanan Weingarten, Herzelia (IL); Erez Sabbag, Kiryat Tivon (IL); Michael Katz, Haifa (IL)

(73) Assignee: Densbits Technologies Ltd., Haifa (IL)

( * ) Notice: Subject to any disclaimer, the term of this patent is extended or adjusted under 35 U.S.C. 154(b) by 0 days.

(21) Appl. No.: 13/231,354

(22) Filed: Sep. 13, 2011

(65) Prior Publication Data

US 2012/0063227 A1  Mar. 15, 2012

Related U.S. Application Data

(60) Provisional application No. 61/383,266, filed on Sep. 15, 2010.

(51) Int. Cl.
*G11C 11/34* (2006.01)

(52) U.S. Cl.
USPC .................................................. 365/185.09

(58) Field of Classification Search
USPC .................................................. 365/185.09
See application file for complete search history.

(56) References Cited

U.S. PATENT DOCUMENTS

| | | | |
|---|---|---|---|
| 4,463,375 A | 7/1984 | Macovski | |
| 4,584,686 A | 4/1986 | Fritze | |
| 4,589,084 A | 5/1986 | Fling et al. | |
| 4,866,716 A | 9/1989 | Weng | |
| 5,077,737 A | 12/1991 | Leger et al. | |
| 5,297,153 A | 3/1994 | Baggen et al. | |
| 5,657,332 A | 8/1997 | Auclair et al. | |
| 5,729,490 A | 3/1998 | Calligaro et al. | |
| 5,793,774 A | 8/1998 | Usui et al. | |
| 5,926,409 A | 7/1999 | Engh et al. | |
| 5,956,268 A | 9/1999 | Lee | |
| 5,982,659 A | 11/1999 | Irrinki et al. | |
| 6,038,634 A | 3/2000 | Ji et al. | |
| 6,094,465 A | 7/2000 | Stein et al. | |
| 6,119,245 A | 9/2000 | Hiratsuka | |
| 6,182,261 B1 | 1/2001 | Haller et al. | |
| 6,192,497 B1 | 2/2001 | Yang et al. | |
| 6,195,287 B1 | 2/2001 | Hirano | |
| 6,199,188 B1 | 3/2001 | Shen et al. | |
| 6,209,114 B1 | 3/2001 | Wolf et al. | |
| 6,259,627 B1 | 7/2001 | Wong | |
| 6,278,633 B1 | 8/2001 | Wong et al. | |
| 6,279,133 B1 | 8/2001 | Vafai et al. | |

(Continued)

OTHER PUBLICATIONS

Search Report of PCT Patent Application WO 2009/118720 A3.

(Continued)

*Primary Examiner* — Hoai V Ho
*Assistant Examiner* — Pablo Huerta
(74) *Attorney, Agent, or Firm* — Dentons US LLP

(57) ABSTRACT

A system and method for adjusting read threshold voltage values, for example, in a read circuit internal to a memory device. The quality of an associated read result may be estimated for each read threshold voltage value used to read memory cells. Only read results estimated to have sufficient quality may be allowed to pass to storage. The read threshold voltage value may be adjusted for subsequent read operations, for example, if the associated read result is estimated to have insufficient quality. The read threshold voltage value may be iteratively adjusted, for example, until a read result is estimated to have sufficient quality.

42 Claims, 9 Drawing Sheets

(56) References Cited

U.S. PATENT DOCUMENTS

| | | |
|---|---|---|
| 6,301,151 B1 | 10/2001 | Engh et al. |
| 6,370,061 B1 | 4/2002 | Yachareni et al. |
| 6,374,383 B1 | 4/2002 | Weng |
| 6,504,891 B1 | 1/2003 | Chevallier |
| 6,532,169 B1 | 3/2003 | Mann et al. |
| 6,532,556 B1 | 3/2003 | Wong et al. |
| 6,553,533 B2 | 4/2003 | Demura et al. |
| 6,560,747 B1 | 5/2003 | Weng |
| 6,637,002 B1 | 10/2003 | Weng et al. |
| 6,639,865 B2 | 10/2003 | Kwon |
| 6,674,665 B1 | 1/2004 | Mann et al. |
| 6,704,902 B1 | 3/2004 | Shinbashi et al. |
| 6,751,766 B2 | 6/2004 | Guterman et al. |
| 6,772,274 B1 | 8/2004 | Estakhri |
| 6,781,910 B2 | 8/2004 | Smith |
| 6,792,569 B2 | 9/2004 | Cox et al. |
| 6,873,543 B2 | 3/2005 | Smith et al. |
| 6,891,768 B2 | 5/2005 | Smith et al. |
| 6,914,809 B2 | 7/2005 | Hilton et al. |
| 6,915,477 B2 | 7/2005 | Gollamudi et al. |
| 6,952,365 B2 | 10/2005 | Gonzalez et al. |
| 6,961,890 B2 | 11/2005 | Smith |
| 6,990,012 B2 | 1/2006 | Smith et al. |
| 6,996,004 B1 | 2/2006 | Fastow et al. |
| 6,999,854 B2 | 2/2006 | Roth |
| 7,010,739 B1 | 3/2006 | Feng et al. |
| 7,012,835 B2 | 3/2006 | Gonzalez et al. |
| 7,038,950 B1 | 5/2006 | Hamilton et al. |
| 7,068,539 B2 | 6/2006 | Guterman et al. |
| 7,079,436 B2 | 7/2006 | Perner et al. |
| 7,149,950 B2 | 12/2006 | Spencer et al. |
| 7,164,601 B2 * | 1/2007 | Mitani et al. ............. 365/185.03 |
| 7,177,977 B2 | 2/2007 | Chen et al. |
| 7,191,379 B2 | 3/2007 | Adelmann et al. |
| 7,196,946 B2 | 3/2007 | Chen et al. |
| 7,203,874 B2 | 4/2007 | Roohparvar |
| 7,290,203 B2 | 10/2007 | Emma et al. |
| 7,292,365 B2 | 11/2007 | Knox |
| 7,301,928 B2 | 11/2007 | Nakabayashi et al. |
| 7,423,898 B2 * | 9/2008 | Tanizaki et al. ............... 365/148 |
| 7,441,067 B2 | 10/2008 | Gorobets et al. |
| 7,466,575 B2 | 12/2008 | Shalvi et al. |
| 7,466,592 B2 * | 12/2008 | Mitani et al. ............... 365/185.2 |
| 7,533,328 B2 | 5/2009 | Alrod et al. |
| 7,558,109 B2 | 7/2009 | Brandman et al. |
| 7,593,263 B2 | 9/2009 | Sokolov et al. |
| 7,697,326 B2 | 4/2010 | Sommer et al. |
| 7,706,182 B2 | 4/2010 | Shalvi et al. |
| 7,804,718 B2 | 9/2010 | Kim |
| 7,805,663 B2 | 9/2010 | Brandman et al. |
| 7,805,664 B1 | 9/2010 | Yang et al. |
| 7,844,877 B2 | 11/2010 | Litsyn et al. |
| 7,961,797 B1 | 6/2011 | Yang et al. |
| 8,020,073 B2 | 9/2011 | Emma et al. |
| 8,122,328 B2 | 2/2012 | Liu et al. |
| 8,248,831 B2 * | 8/2012 | Rotbard et al. .................. 365/45 |
| 2002/0063774 A1 | 5/2002 | Hillis et al. |
| 2002/0085419 A1 | 7/2002 | Kwon et al. |
| 2002/0154769 A1 | 10/2002 | Petersen et al. |
| 2003/0065876 A1 | 4/2003 | Lasser |
| 2003/0101404 A1 | 5/2003 | Zhao et al. |
| 2003/0105620 A1 | 6/2003 | Bowen |
| 2003/0169622 A1 * | 9/2003 | Ooishi et al. ............. 365/185.21 |
| 2003/0192007 A1 | 10/2003 | Miller et al. |
| 2004/0015771 A1 | 1/2004 | Lasser et al. |
| 2004/0030971 A1 | 2/2004 | Tanaka et al. |
| 2004/0153722 A1 | 8/2004 | Lee |
| 2004/0153817 A1 | 8/2004 | Norman et al. |
| 2004/0181735 A1 | 9/2004 | Xin |
| 2005/0013165 A1 | 1/2005 | Ban |
| 2005/0018482 A1 | 1/2005 | Cemea et al. |
| 2005/0083735 A1 | 4/2005 | Chen et al. |
| 2005/0117401 A1 | 6/2005 | Chen et al. |
| 2005/0120265 A1 | 6/2005 | Pline et al. |
| 2005/0128811 A1 | 6/2005 | Kato et al. |
| 2005/0138533 A1 | 6/2005 | Le-Bars et al. |
| 2005/0144213 A1 | 6/2005 | Simkins et al. |
| 2005/0144368 A1 | 6/2005 | Chung et al. |
| 2005/0169057 A1 | 8/2005 | Shibata et al. |
| 2005/0172179 A1 | 8/2005 | Brandenberger et al. |
| 2005/0213393 A1 | 9/2005 | Lasser |
| 2006/0059406 A1 | 3/2006 | Micheloni et al. |
| 2006/0059409 A1 | 3/2006 | Lee |
| 2006/0064537 A1 | 3/2006 | Oshima et al. |
| 2006/0101193 A1 | 5/2006 | Murin |
| 2006/0203587 A1 | 9/2006 | Li et al. |
| 2006/0221692 A1 | 10/2006 | Chen |
| 2006/0248434 A1 | 11/2006 | Radke et al. |
| 2006/0268608 A1 | 11/2006 | Noguchi et al. |
| 2006/0294312 A1 | 12/2006 | Walmsley |
| 2007/0025157 A1 | 2/2007 | Wan et al. |
| 2007/0063180 A1 | 3/2007 | Asano et al. |
| 2007/0103992 A1 | 5/2007 | Sakui et al. |
| 2007/0104004 A1 | 5/2007 | So et al. |
| 2007/0109858 A1 | 5/2007 | Conley et al. |
| 2007/0124652 A1 | 5/2007 | Litsyn et al. |
| 2007/0143561 A1 | 6/2007 | Gorobets |
| 2007/0150694 A1 | 6/2007 | Chang et al. |
| 2007/0168625 A1 | 7/2007 | Cornwell et al. |
| 2007/0171714 A1 | 7/2007 | Wu et al. |
| 2007/0171730 A1 | 7/2007 | Ramamoorthy et al. |
| 2007/0180346 A1 | 8/2007 | Murin |
| 2007/0223277 A1 | 9/2007 | Tanaka et al. |
| 2007/0226582 A1 | 9/2007 | Tang et al. |
| 2007/0226592 A1 | 9/2007 | Radke |
| 2007/0228449 A1 | 10/2007 | Takano et al. |
| 2007/0253249 A1 | 11/2007 | Kang et al. |
| 2007/0253250 A1 | 11/2007 | Shibata et al. |
| 2007/0263439 A1 | 11/2007 | Cornwell et al. |
| 2007/0266291 A1 | 11/2007 | Toda et al. |
| 2007/0271494 A1 | 11/2007 | Gorobets |
| 2008/0010581 A1 | 1/2008 | Alrod et al. |
| 2008/0028014 A1 | 1/2008 | Hilt et al. |
| 2008/0055989 A1 | 3/2008 | Lee et al. |
| 2008/0082897 A1 | 4/2008 | Brandman et al. |
| 2008/0092026 A1 | 4/2008 | Brandman et al. |
| 2008/0104309 A1 | 5/2008 | Cheon et al. |
| 2008/0116509 A1 | 5/2008 | Harari et al. |
| 2008/0123419 A1 * | 5/2008 | Brandman et al. ....... 365/185.09 |
| 2008/0126686 A1 | 5/2008 | Sokolov et al. |
| 2008/0127104 A1 | 5/2008 | Li et al. |
| 2008/0128790 A1 | 6/2008 | Jung |
| 2008/0130341 A1 | 6/2008 | Shalvi et al. |
| 2008/0137413 A1 | 6/2008 | Kong et al. |
| 2008/0148115 A1 | 6/2008 | Sokolov et al. |
| 2008/0158958 A1 | 7/2008 | Shalvi et al. |
| 2008/0159059 A1 | 7/2008 | Moyer |
| 2008/0162079 A1 | 7/2008 | Astigarraga et al. |
| 2008/0162816 A1 | 7/2008 | Lee |
| 2008/0168320 A1 | 7/2008 | Cassuto et al. |
| 2008/0181001 A1 | 7/2008 | Shalvi |
| 2008/0198650 A1 | 8/2008 | Shalvi et al. |
| 2008/0198652 A1 | 8/2008 | Shalvi et al. |
| 2008/0219050 A1 | 9/2008 | Shalvi et al. |
| 2008/0225599 A1 | 9/2008 | Chae |
| 2008/0263262 A1 | 10/2008 | Sokolov et al. |
| 2008/0282106 A1 | 11/2008 | Shalvi et al. |
| 2008/0285351 A1 | 11/2008 | Shlick et al. |
| 2008/0301532 A1 | 12/2008 | Uchikawa et al. |
| 2009/0024905 A1 | 1/2009 | Shalvi et al. |
| 2009/0043951 A1 | 2/2009 | Shalvi et al. |
| 2009/0072303 A9 | 3/2009 | Prall et al. |
| 2009/0091979 A1 | 4/2009 | Shalvi |
| 2009/0103358 A1 | 4/2009 | Sommer et al. |
| 2009/0106485 A1 | 4/2009 | Anholt |
| 2009/0113275 A1 | 4/2009 | Chen et al. |
| 2009/0125671 A1 | 5/2009 | Flynn et al. |
| 2009/0144600 A1 | 6/2009 | Perlmutter et al. |
| 2009/0150748 A1 | 6/2009 | Egner et al. |
| 2009/0157964 A1 | 6/2009 | Kasorla et al. |
| 2009/0158126 A1 | 6/2009 | Perlmutter et al. |
| 2009/0168524 A1 | 7/2009 | Golov et al. |
| 2009/0187803 A1 | 7/2009 | Anholt et al. |
| 2009/0199074 A1 | 8/2009 | Sommer |

| | | |
|---|---|---|
| 2009/0213653 A1 | 8/2009 | Perlmutter et al. |
| 2009/0213654 A1 | 8/2009 | Perlmutter et al. |
| 2009/0228761 A1 | 9/2009 | Perlmutter et al. |
| 2009/0240872 A1 | 9/2009 | Perlmutter et al. |
| 2010/0005270 A1 | 1/2010 | Jiang |
| 2010/0058146 A1 | 3/2010 | Weingarten et al. |
| 2010/0064096 A1 | 3/2010 | Weingarten et al. |
| 2010/0088557 A1 | 4/2010 | Weingarten et al. |
| 2010/0091535 A1 | 4/2010 | Sommer et al. |
| 2010/0095186 A1 | 4/2010 | Weingarten |
| 2010/0110787 A1 | 5/2010 | Shalvi et al. |
| 2010/0115376 A1 | 5/2010 | Shalvi et al. |
| 2010/0122113 A1 | 5/2010 | Weingarten et al. |
| 2010/0124088 A1 | 5/2010 | Shalvi et al. |
| 2010/0131580 A1 | 5/2010 | Kanter et al. |
| 2010/0131806 A1 | 5/2010 | Weingarten et al. |
| 2010/0131809 A1 | 5/2010 | Katz |
| 2010/0131826 A1 | 5/2010 | Shalvi et al. |
| 2010/0131827 A1 | 5/2010 | Sokolov et al. |
| 2010/0131831 A1 | 5/2010 | Weingarten et al. |
| 2010/0146191 A1 | 6/2010 | Katz |
| 2010/0146192 A1 | 6/2010 | Weingarten et al. |
| 2010/0149881 A1 | 6/2010 | Lee et al. |
| 2010/0180073 A1 | 7/2010 | Weingarten et al. |
| 2010/0199149 A1 | 8/2010 | Weingarten et al. |
| 2010/0211724 A1 | 8/2010 | Weingarten |
| 2010/0211833 A1 | 8/2010 | Weingarten |
| 2010/0211856 A1 | 8/2010 | Weingarten |
| 2010/0251066 A1 | 9/2010 | Radke |
| 2010/0253555 A1 | 10/2010 | Weingarten et al. |
| 2010/0257309 A1 | 10/2010 | Barsky et al. |
| 2010/0293321 A1 | 11/2010 | Weingarten |
| 2011/0051521 A1 | 3/2011 | Levy et al. |
| 2011/0055461 A1 | 3/2011 | Steiner et al. |
| 2011/0096612 A1 | 4/2011 | Steiner et al. |
| 2011/0119562 A1 | 5/2011 | Steiner et al. |
| 2011/0153919 A1 | 6/2011 | Sabbag |
| 2011/0161775 A1 | 6/2011 | Weingarten |
| 2011/0214029 A1 | 9/2011 | Steiner et al. |
| 2011/0214039 A1 | 9/2011 | Steiner et al. |
| 2011/0246792 A1 | 10/2011 | Weingarten |
| 2011/0246852 A1 | 10/2011 | Sabbag |
| 2011/0252187 A1 | 10/2011 | Segal et al. |
| 2011/0252188 A1 | 10/2011 | Weingarten |
| 2011/0271043 A1 | 11/2011 | Segal et al. |
| 2011/0302428 A1 | 12/2011 | Weingarten |
| 2012/0001778 A1 | 1/2012 | Steiner et al. |
| 2012/0005554 A1 | 1/2012 | Steiner et al. |
| 2012/0005558 A1 | 1/2012 | Steiner et al. |
| 2012/0005560 A1 | 1/2012 | Steiner et al. |
| 2012/0008401 A1 | 1/2012 | Katz et al. |
| 2012/0008414 A1 | 1/2012 | Katz et al. |
| 2012/0051144 A1 | 3/2012 | Weingarten et al. |
| 2012/0063227 A1 | 3/2012 | Weingarten et al. |
| 2012/0066441 A1 | 3/2012 | Weingarten |
| 2012/0110250 A1 | 5/2012 | Sabbag et al. |

OTHER PUBLICATIONS

Search Report of PCT Patent Application WO 2009/095902 A3.
Search Report of PCT Patent Application WO 2009/078006 A3.
Search Report of PCT Patent Application WO 2009/074979 A3.
Search Report of PCT Patent Application WO 2009/074978 A3.
Search Report of PCT Patent Application WO 2009/072105 A3.
Search Report of PCT Patent Application WO 2009/072104 A3.
Search Report of PCT Patent Application WO 2009/072103 A3.
Search Report of PCT Patent Application WO 2009/072102 A3.
Search Report of PCT Patent Application WO 2009/072101 A3.
Search Report of PCT Patent Application WO 2009/072100 A3.
Search Report of PCT Patent Application WO 2009/053963 A3.
Search Report of PCT Patent Application WO 2009/053962 A3.
Search Report of PCT Patent Application WO 2009/053961 A3.
Search Report of PCT Patent Application WO 2009/037697 A3.
Yani Chen, Keshab K. Parhi, "Small Area Parallel Chien Search Architectures for Long BCH Codes", Ieee Transactions on Very Large Scale Integration(VLSI) Systems, vol. 12, No. 5, May 2004.
Yuejian Wu, "Low Power Decoding of BCH Codes", Nortel Networks, Ottawa, Ont., Canada, in Circuits and systems, 2004. ISCAS '04. Proceeding of the 2004 International Symposium on Circuits and Systems, published May 23-26, 2004, vol. 2, p. II-369-72 vol. 2.
Michael Purser, "Introduction to Error Correcting Codes", Artech House Inc., 1995.
Ron M. Roth, "Introduction to Coding Theory", Cambridge University Press, 2006.
Akash Kumar, Sergei Sawitzki, "High-Throughput and Low Power Architectures for Reed Solomon Decoder", (a.kumar at tue.nl, Eindhoven University of Technology and sergei.sawitzki at philips.com).
Todd K.Moon, "Error Correction Coding Mathematical Methods and Algorithms", A John Wiley & Sons, Inc., 2005.
Richard E. Blahut, "Algebraic Codes for Data Transmission", Cambridge University Press, 2003.
David Esseni, Bruno Ricco, "Trading-Off Programming Speed and Current Absorption in Flash Memories with the Ramped-Gate Programming Technique", Ieee Transactions on Electron Devices, vol. 47, No. 4, Apr. 2000.
Giovanni Campardo, Rino Micheloni, David Novosel, "VLSI-Design of Non-Volatile Memories", Springer Berlin Heidelberg New York, 2005.
John G. Proakis, "Digital Communications", 3rd ed., New York: McGraw-Hill, 1995.
J.M. Portal, H. Aziza, D. Nee, "EEPROM Memory: Threshold Voltage Built in Self Diagnosis", ITC International Test Conference, Paper 2.1.
J.M. Portal, H. Aziza, D. Nee, "EEPROM Diagnosis Based on Threshold Voltage Embedded Measurement", Journal of Electronic Testing: Theory and Applications 21, 33-42, 2005.
G. Tao, A. Scarpa, J. Dijkstra, W. Stidl, F. Kuper, "Data retention prediction for modern floating gate non-volatile memories", Microelectronics Reliability 40 (2000), 1561-1566.
T. Hirncno, N. Matsukawa, H. Hazama, K. Sakui, M. Oshikiri, K. Masuda, K. Kanda, Y. Itoh, J. Miyamoto, "A New Technique for Measuring Threshold Voltage Distribution in Flash EEPROM Devices", Proc. IEEE 1995 Int. Conference on Microelectronics Test Structures, vol. 8, Mar. 1995.
Boaz Eitan, Guy Cohen, Assaf Shappir, Eli Lusky, Amichai Givant, Meir Janai, Ilan Bloom, Yan Polansky, Oleg Dadashev, Avi Lavan, Ran Sahar, Eduardo Maayan, "4-bit per Cell NROM Reliability", Appears on the website of Saifun.com.
Paulo Cappelletti, Clara Golla, Piero Olivo, Enrico Zanoni, "Flash Memories", Kluwer Academic Publishers, 1999.
JEDEC Standard, "Stress-Test-Driven Qualification of Integrated Circuits", JEDEC Solid State Technology Association. JEDEC Standard No. 47F pp. 1-26.
Dempster, et al., "Maximum Likelihood from Incomplete Data via the EM Algorithm", Journal of the Royal Statistical Society. Series B (Methodological), vol. 39, No. 1 (1997), pp. 1-38.
Mielke, et al., "Flash EEPROM Threshold Instabilities due to Charge Trapping During Program/Erase Cycling", IEEE Transactions on Device and Materials Reliability, vol. 4, No. 3, Sep. 2004, pp. 335-344.
Daneshbeh, "Bit Serial Systolic Architectures for Multiplicative Inversion and Division over GF (2)", A thesis presented to the University of Waterloo, Ontario, Canada, 2005, pp. 1-118.
Chen, Formulas for the solutions of Quadratic Equations over GF (2), IEEE Trans. Inform. Theory, vol. IT-28, No. 5, Sep. 1982, pp. 792-794.
Berlekamp et al., "On the Solution of Algebraic Equations over Finite Fields", Inform. Cont. 10, Oct. 1967, pp. 553-564.

* cited by examiner

SYSTEM AND METHOD FOR ADJUSTING READ VOLTAGE THRESHOLDS IN MEMORIES

REFERENCE TO RELATED APPLICATIONS

This patent application claims priority from U.S. provisional patent application Ser. No. 61/383,266 filed Sep. 15, 2010, which is incorporated herein by reference in its entirety.

FIELD OF THE INVENTION

Embodiments of the present invention relate to systems and methods for programming and reading memory devices, such as, Flash memory devices. In particular, embodiments of the present invention relate to adjusting read voltage thresholds for optimizing the accuracy of reading data from memory devices.

BACKGROUND OF THE INVENTION

Flash memory devices may store information in the form of electrical charge. Each cell of the flash memory devices may have a substrate, a transistor gate and an additional floating metal transistor gate between the substrate and the transistor gate. Charge may be stored in the floating gate during programming by injecting electrons into the floating gate. Cells are typically programmed in groups, for example, written page-by-page and erased block-by-block. In single-level cell (SLC) devices, each cell may either be programmed with charge or may remain un-programmed (erased), thus effectively defining two binary states to store one bit of information per cell. In multi-level cell (MLC) devices, each cell may store more than one bit of information at each transistor. As the charge in the floating gate may vary continuously, MLC devices may apply electrical charge to the floating gates in one of multiple (n) levels. Thus, an (n)-level flash cell, where $n=2^k$, may store k bits of information, where each combination of k bits is mapped to one of n program levels (e.g. via Gray coding).

The amount of electrical charge stored in the floating gate cell may be directly related to the voltage level used to fully conduct current across the cell's transistor gate. Therefore, the amount of charge in a cell may be measured by the minimal gate voltage level used for conduction (e.g., also known as threshold voltage, $V_T$). Since the actual charge level may vary among cells programmed to a certain program level, the specific threshold voltage may also vary among these cells.

Flash memory devices may be read by comparing the threshold voltage of cells to one or more read thresholds or decision levels. The read thresholds may distinguish a plurality of different voltage ranges, each associated with a different one of (n) program levels of the multi-level cell. Read operations may determine within which voltage range is the threshold voltage for conducting each cell, and therefore, the associated program level and value of the cell.

During the life span of a flash memory device, the insulating properties of the floating gates may degrade and electrons may escape from the cells causing the cell charge to shift or decrease, which may be referred to as "charge loss." Charge loss or other errors in the charge stored in cells may result from programming errors (e.g., either intentional or not), age, storage temperature, repeated use of program/erase cycles, retention and various other reasons. Charge loss may cause a shift in the charge of cells, which may cause errors when read by un-shifted thresholds previously generated for fully charged cells.

SUMMARY OF THE INVENTION

Embodiments of the invention may provide a system and method for adjusting read threshold voltage values, for example, in a read circuit internal to a memory device. The quality of an associated read result may be estimated for each read threshold voltage value used to read memory cells. Only read results estimated to have sufficient quality may be allowed to pass to storage. The read threshold voltage value may be adjusted for subsequent read operations, for example, if the associated read result is estimated to have insufficient quality. The read threshold voltage value may be iteratively adjusted, for example, until a read result is estimated to have sufficient quality.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

Figure 1:
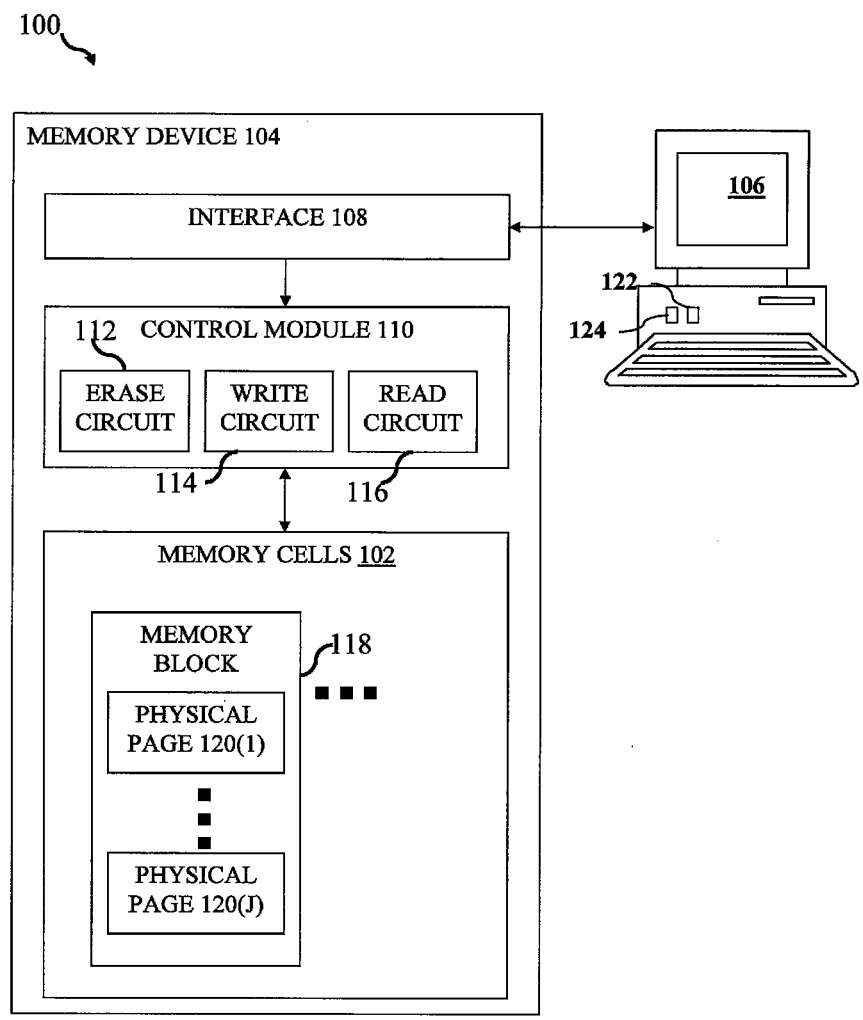
FIG. 1 schematically illustrates a system for programming and reading memory cells in a memory device.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

DETAILED DESCRIPTION OF THE INVENTION

In the following description, various aspects of the present invention will be described. For purposes of explanation, specific configurations and details are set forth in order to provide a thorough understanding of the present invention. However, it will also be apparent to one skilled in the art that the present invention may be practiced without the specific details presented herein. Furthermore, well known features may be omitted or simplified in order not to obscure the present invention.

Unless specifically stated otherwise, as apparent from the following discussions, it is appreciated that throughout the specification discussions utilizing terms such as "processing," "computing," "calculating," "determining," or the like, refer to the action and/or processes of a computer or computing system, or similar electronic computing device, that manipulates and/or transforms data represented as physical, such as electronic, quantities within the computing system's registers and/or memories into other data similarly represented as physical quantities within the computing system's memories, registers or other such information storage, transmission or display devices.

Over time, memory cells may degrade causing charge loss, for example, due to a combination of high cycling and retention. As the memory cells lose charge, previously computed read thresholds may generate read results. Conventional flash memory devices may be unable to anticipate such degradation or to correct the errors caused by charge loss. Instead, some conventional systems use a constant set of thresholds, regardless of the degradation state. However, the constant set of thresholds may increase the number of errors, especially following cycling and retention. Other conventional systems may re-compute new read thresholds, but rely on an external processor to re-compute the new read thresholds. Such external control requires additional steps to transfer and handle computations externally, wasting processing time, and may interrupt or stall the internal read operation flow of memory devices. Furthermore, since the read thresholds are controlled externally, the flash memory devices are not self-sufficient and require external supporting devices or software to efficiently run.

According to embodiments of the invention, a memory device is provided having internal controls to adjust and optimize read thresholds within the memory device itself, for example, integrated into each read cycle. Such self-sufficient memory devices may significantly speed up computations by avoiding unnecessary communication with an external controller. Furthermore, such memory devices may use a minimal gate count or number of logic units for read/program operations.

Reference is made to FIG. 1, which schematically illustrates a system 100 for programming and reading memory cells 102 in a memory device 104 according to an embodiment of the invention.

Memory device 104 may include an interface 108, such as, an open NAND Flash memory interface (ONFI) or Toggle NAND interface, to communicate with other devices, for example, a computer device 106. Computer device 106 may be any device capable of executing a series of instructions to write, read, modify, erase, store, save, recover, process, encode, decode, compute, edit, receive, transfer, display, or otherwise use or manipulate data. Computer device 106 may include one or more computers, workstations, cellular device, tablet devices, personal digital assistants (PDA), video game consoles, etc. In one embodiment, computer device 106 may be a computer and memory device 104 may be a connected flash memory, secure digital (SD) card or disk drive. In one embodiment, computer device 106 may include a processor 122, for example, to receive data from memory device 104 via interface 108 and an internal memory device 124, for example, to store the received data. In another embodiment, computer device 106 may be a simple controller, such as that used in embedded multi-media card (EMMC) devices or SD cards.

Memory device 104 may include a control module 110 to program memory cells 102. Control module 110 may have an erase circuit 112, a write circuit 114 and a read circuit 116, for erasing, writing and reading data to/from memory cells 102. Circuits 112, 114, 116 may include one or more dedicated hardware units, or control module 110 executing software.

Memory cells 102 may include an array of cells in a non-volatile memory unit, for example, a flash memory, such as, NOR-type flash memory, negated AND (NAND)-type flash memory, and/or phase-change random access memory (PRAM), an external drive such as a disk or tape drive, a universal system bus (USB) drive, a solid-state drive, a memory card such as a SD card, a Multi-Media Card (MMC), an eMMC, a network card, an input/output device port and/or a memory in an internal or external device. In another embodiment, memory cells 102 may be in a volatile memory unit. Volatile memory is typically used for short-term storage and non-volatile memory is typically used for long-term storage, although either memory may be used for either short or long term storage.

Memory cells 102 may be divided into one or more memory blocks 118, each of which may include one or more pages 120 (1)-(J). Each page 120 may include a portion of data (e.g., 512 bytes-8 Kbytes) representing original information and optionally a portion of data (e.g., 16-32 bytes for every 512 data bytes of data) representing redundancy data, such as error correction data and/or meta data. A plurality of cells may be processed together as a page 120 and a plurality of pages may be processed together as a block 118, such as an erase block. In some embodiments, memory cells 102 may be erased, for example, block-by-block, but may be written into and/or read, for example, page-by-page. Other groupings or partitions of data or memory cells 102 may be used.

Memory cells 102 may include single-level cells and/or multi-level cells. Each multi-level cell may include (to an acceptable level of certainty) more than two statistically distinguishable voltage regions or levels, for example, one corresponding to a zero value and at least two or more other regions corresponding to different non-zero values, defining (e.g., $2^k-1$) binary states for the multiple (e.g., k) bits in each cell. The number (e.g., k) of bits of information in multi-level cells may be greater than one and may or may not be an integer number.

Memory device 104 may receive a write instruction to write data in a data stream addressed to memory cells 102. The write instruction may be received, for example, from computer device 106 via interface 108. To write the data, control module 110 may inject electrons into the cells of memory cells 102 via pulses of charge to accumulate a cell charge corresponding to the program data level. Control module 110 may program a group of cells together, for example, a row of cells in a memory block 118. Each row may be programmed in a sequence of stages one page at a time. In each sequential programming stage for an $M^{th}$ bit, control module 110 may inject electrons into each cell to induce a voltage in the one of the (e.g., $2^M$) binary bit states defined by the source data for the $M^{th}$ bit. When memory device 104 receives an erase instruction or an instruction to write to previously written cells, control module 110 may delete electrons from a cell block 118, for example, to reduce the cell charge to a constant reference charge value.

Memory device 104 may receive a read instruction to read data from memory cells 102. The read instruction may be received, for example, from computer device 106 via host interface 108. To read the data, control module 110 may supply voltage to the cells at each read threshold. Those cells that conduct at each threshold may be assigned a corresponding bit value.

However, the charge programmed into memory cells 102 may degrade over time. Thus, read thresholds may likewise be adjusted to compensate for the charge loss to accurately read memory cells 102. In contrast to conventional systems which use computer device 106 to adjust read thresholds externally to memory device 104, control module 110 has internal circuitry to adjust read thresholds within memory device 104 itself, thereby reducing the computational overhead used to transfer data and communicate with external devices.

Control module 110 may, for each read threshold voltage value used to read memory cells 102, estimate the quality of an associated read result. If the associated read result is estimated to have sufficient quality, control module 110 may accept the results read at that threshold and may store, transfer or otherwise use the results. Otherwise, control module 110 may discard the results and adjust the threshold voltage to re-read memory cells 102. Accordingly, control module 110 may selectively filter good quality read results and adjust poor quality read thresholds as part of the internal read operations of memory device 104.

Figure 2:
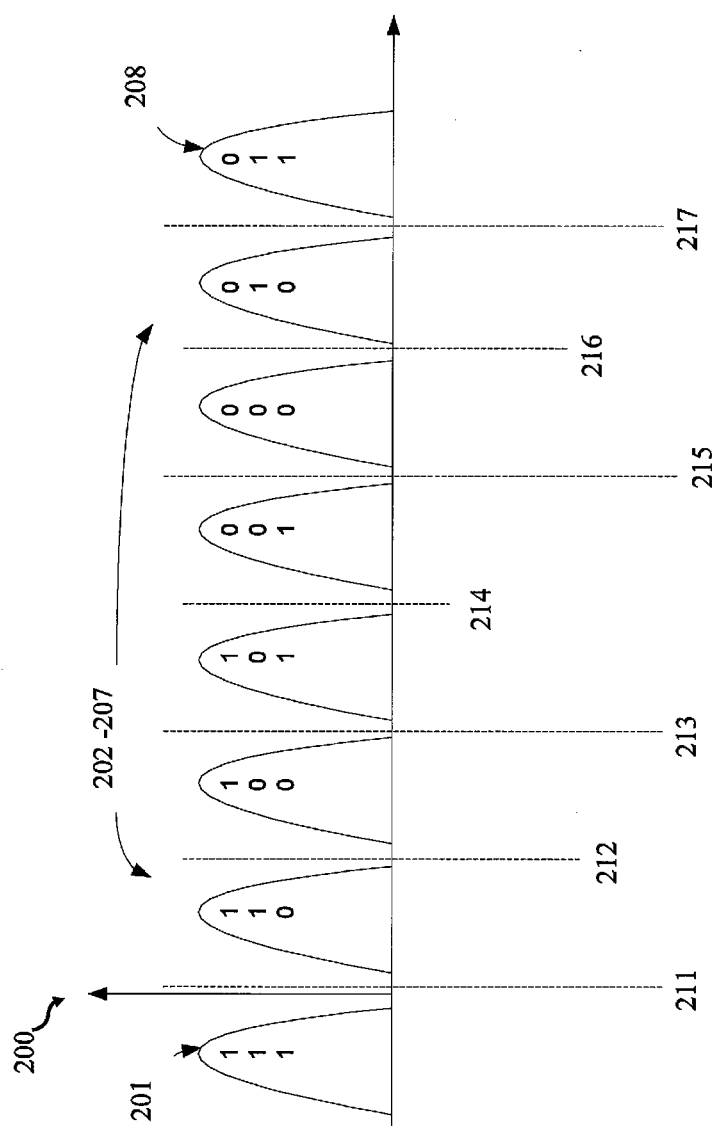
FIGS. 2 and 3 schematically illustrate probability distribution functions for memory cells and corresponding read thresholds, for example, for three bit per cell and two bit per cell memory devices, respectively.
Figure 3:
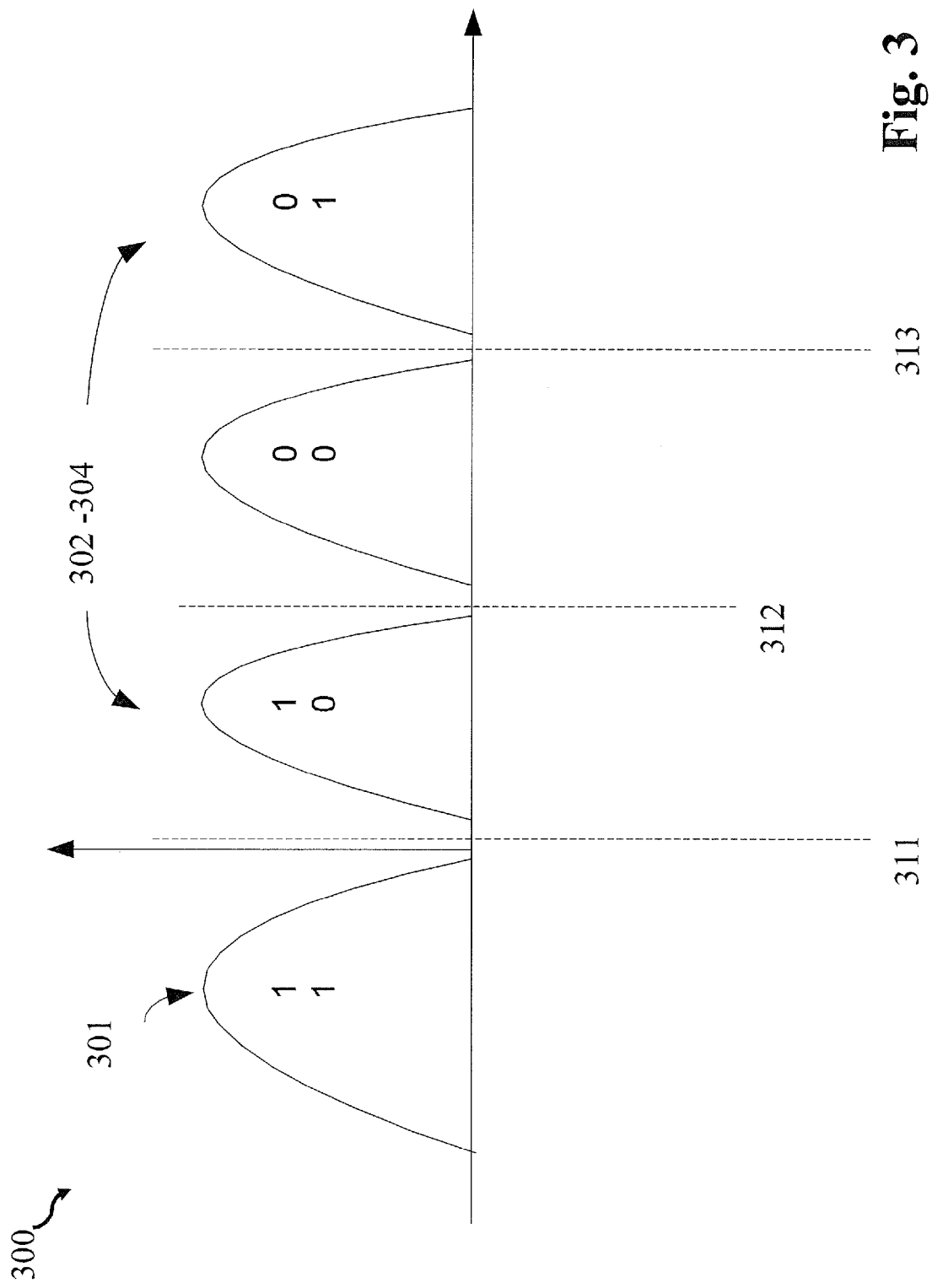

Reference is made to FIGS. 2 and 3, which schematically illustrate probability distribution functions (PDFs) 200 and 300 of a set of memory cells and corresponding read thresholds. In the example of FIG. 2, PDF 200 represents the probability distribution of a three bit per cell (3 bpc) memory device. A 3 bpc memory device may store data in a most-significant bit (MSB) page, a center significant bit (CSB) page, and a least-significant bit (LSB) page. In the example of FIG. 3, PDF 300 represents the probability distribution a two bit per cell (2 bpc) memory device. A 2 bpc memory device may store data in a MSB page and an LSB page. Other numbers of bpc or storage structures may be used.

Referring to FIG. 2, PDF 200 may include a plurality of (e.g., $2^3$) lobes 201-208, each associated with a different one of the (e.g., $2^3$) program levels of the cells. Each lobe 201-208 may define a voltage range (e.g., or uncertainty) centered about some voltage value for each program level. Any cell voltage that falls within one of lobes 201-208 may be assigned to the corresponding program level. The mapping between lobes 201-208 and the program levels for the 3 information bits is marked on each lobe in FIG. 2, for example, from "111" to "011".

Lobes 201-208 may be divided by read thresholds 211-217, which define the boundary voltages of the lobes. Read thresholds 211-217 may be divided into three sets (marked by 3 types of lines in FIG. 2) for retrieving MSB, CSB, or LSB information, respectively. The MSB page (e.g., defining a $1^{st}$ bit) may be read using only the single read threshold 214. Cells with a threshold voltage less than read threshold 214 may be read as "1", while cells with a threshold voltage greater than (or equal to) read threshold 214 may be read as "0". The CSB page (e.g., defining a $2^{nd}$ bit) may be read using read thresholds 212 and 216. Cells with a threshold voltage less than 212 or above 216 may be read as "1", while the remaining cells may be read as "0". The LSB page (e.g., defining a $3^{rd}$ bit) may be read using read thresholds 211, 213, 215, and 217. Cells with a threshold voltage less than 211, or between 213 and 215, or above 217 may be read as "1", while the remaining cells may be read as "0".

The position of read thresholds 211-217 may determine the accuracy of data read from the memory cells. If read thresholds are placed incorrectly, many read errors may occur. A read error may occur, for example, when a cell, which is programmed to one program level, is erroneously read as belonging to another program level. This may occur if an outer limit (e.g., tail-end) of a first program level's lobe extends significantly beyond the read threshold which is used to distinguish between the first program level and a second neighboring program level (some overlap is expected). Therefore, accurate read thresholds may be placed in between lobes 201-208 of the threshold voltage distributions, such that for each read threshold, there is minimal overlap between the outer limits of the lobes for any two adjacent program levels.

Referring to FIG. 3, PDF 300 may include a plurality of (e.g., $2^2$) lobes 301-304, each associated with a different one of the (e.g., $2^2$) program levels of the cells. Lobes 301-304 may be distinguished by read thresholds 311-313 for retrieving MSB and LSB information. The MSB page may be read using the single read threshold 312, while the LSB page may be read using the two read thresholds 311 and 313.

Figure 4:
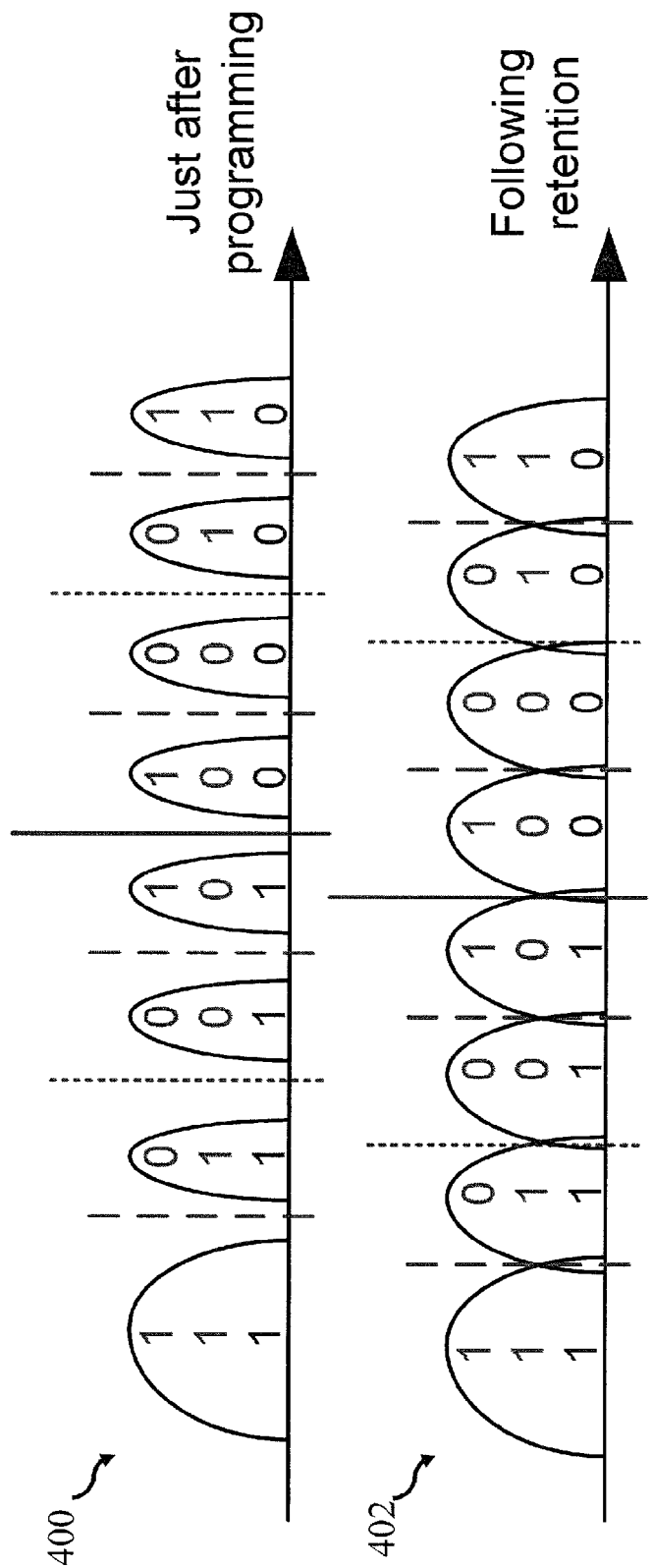
FIG. 4 schematically illustrates probability distribution functions for memory cells and corresponding read thresholds prior to and after charge loss.

Although PDFs 200 and 300 of FIGS. 2 and 3 illustrate non-overlapping lobes, these illustrations are schematics, and in real memory devices, the lobes may overlap, especially after charge loss, as shown in PDF 402 of FIG. 4.

Reference is made to FIG. 4, which schematically illustrates PDFs 400 and 402 for memory cells and corresponding read thresholds prior to and after charge loss, respectively. Soon after programming, memory cells may have their full or near full charge and their associated PDF 400 may have minimal overlap of lobes. However, after the memory cells lose charge, for example, due to retention effects, the lobes of PDF 402 may shift and overlap. Such charge loss may be due to intentional design, for example, to obtain high programming speed, or unintentional retention effects. Retention effects may be caused by the repeated use of program/erase cycles, which accumulates trap charge and is de-trapped over time. Retention effects may cause each lobe in PDF 402 to have a larger standard deviation (std) (e.g., a wider lobe distribution) and a different mean location (e.g., a shifted lobe moved to a lower voltage), as compared to PDF 400. In some embodiments, when the voltage of the lobe is higher, the voltage of the shift may be larger. Such effects may decrease the difference between the mean of the first (erase) lobe and the last (highest) lobe, which may be referred to as an "effective working window." In some embodiments, when the effective working window is decreased, the overlap between lobes typically increases. Accordingly, both the decreased effective working window and the increased width of each lobe may contribute to an increase in read errors. These effects may worsen over time as the memory device is used more and more, increasing the number of program/erase cycles. These effects may also worsen when the dimension of the NAND Flash memory technology node decreases, where the node defines the minimal feature dimensions used in production, for example, of a silicon die for a given process technology.

Due to retention effects, read-thresholds used prior to charge loss (e.g., in PDF 400) may cause read errors after substantial charge loss (e.g., in PDF 402). In fact, no single set of thresholds may be used indefinitely. Accordingly, the memory device may adjust read threshold voltages over time to minimize the number of read errors.

Figure 5:
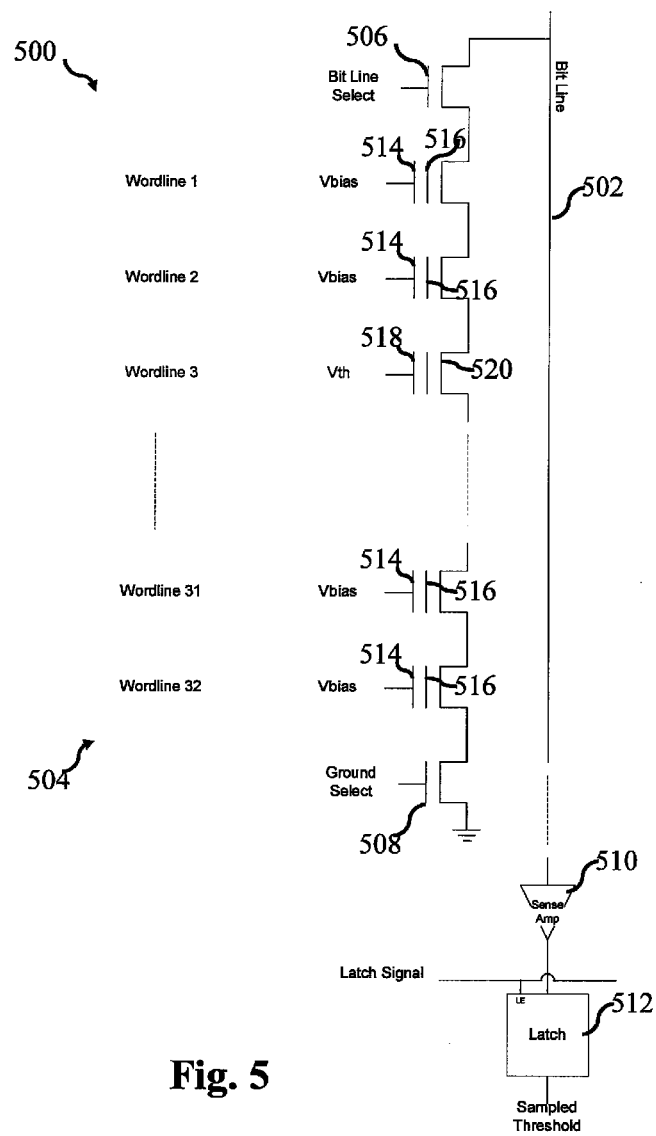
FIG. 5 schematically illustrates a read circuit in a memory device for reading a set of memory cells.

Reference is made to FIG. 5, which schematically illustrates a read circuit in a memory device 500 for reading a set of memory cells 502.

In the example of FIG. 5, the set of memory cells 502 includes 32 memory cells arranged in a bit line 502, although other numbers or arrangements of cells may be used. A typical NAND flash memory device may include, for example, 34,560 bit lines per data block, although other numbers of bit lines and types of memory devices may be used.

Each memory cell in bit line 502 may be associated with a different wordline 504. Each wordline 504 may connect associated cells in different bit lines 502 of a data block. The cells in each bit line 502 may be connected by turning on a bit line select transistor 506 and a ground select transistor 508. Memory device 500 may include a sense amplifier 510 to detect the conductance across cells. Sense amplifier 510 may be connected to bit line 502 and, for example, after a time has elapsed (e.g., 25 microseconds ($\mu S$)) for the bit line voltage to stabilize after transistors 508 and 508 are turned on, the result detected at sense amplifier 510 may be stored in a latch 512.

To read a selected cell within bit line 502 and measure its charge, transistors 514 may apply a relatively high biasing voltage, Vbias, to gates 516 of all other cells in bit line 502 and a transistor 518 may apply a threshold voltage, Vth, to a gate 520 of the selected cell. If the selected cell is charged and transistor 518 applies a voltage below the cell's minimum voltage for conductance, the cell gate 520 may not allow current to flow through the transistor column 506-508 and sense amplifier 510 may output a corresponding indication (e.g., a "0" sense bit). However, if the cell is not charged or the voltage applied across the selected cell is above the cell's minimum voltage for conductance, current may flow through the transistor column 506-508 and sense amplifier 510 may output a corresponding indication (e.g., a "1" sense bit). In other embodiments, the selected cell may be biased with a constant voltage (e.g., Vcc). With a constant voltage the cell may always conduct current. However, the strength of that current may depend on the amount of charge programmed into the cell. Sense amplifier 510 may compare this current against a current conducted by a reference column of transistors. If the current of the cell is higher the reference current, the cell may be assigned a corresponding bit value (e.g., a "1"), while if the current of the cell is less than the reference current, the cell may be assigned a corresponding bit value (e.g., a "0"). Alternatively, the sense amplifier 510 may sample the voltage of the charged bit line 502 at a predefined sampling time following the application of a constant bias voltage on the selected cell. As transistors 506-508 conduct, they discharge bit line 502. If the difference between the constant bias voltage and Vth of the target transistor 518 of the selected cell is small, bit line 502 may only slightly discharge and sense amplifier 510 may sample one result. On the other hand, if the difference is large, bit line 502 may discharge completely before sense amplifier 510 samples the result (or before the result is latched).

Such embodiments describe sampling cells using a single threshold comparison. A single threshold comparison may be sufficient for reading SLC cells or the first bit of MLC cells (e.g., MSB). However, to read the upper bits of MLC cells (e.g., CSB or LSB), more than a single threshold comparison may be used. In some embodiment, each of multiple thresholds for the upper bits may be sampled separately by repeating the single threshold detection for each individual threshold and the results may be combined to determine the upper bit values. Alternatively, several sense amplifiers 510 may be used simultaneously, each sampling cells using a different threshold, where the results may be combined to determine the upper bit values.

In some systems experiencing retention effects, the accuracy of these thresholds may degrade over time. Accordingly, to account for such retention effects and prevent associated errors, embodiments of the invention may be adapted to dynamically adjust read threshold voltages over time. Embodiments of the invention may integrate threshold adjusting mechanisms as part of the internal read circuit of memory devices. Accordingly, memory devices may adjust the threshold voltage, Vth, on-the fly, as part of each read operation. In one embodiment described in reference to FIG. 6, memory devices may include a processor (or a simple state machine), for example, an internal or "acquisition" processor, integrated into the read circuit to determine, for each sampling threshold, whether to accept the results read at that threshold or to reject the results and adjust the threshold.

Figure 6:
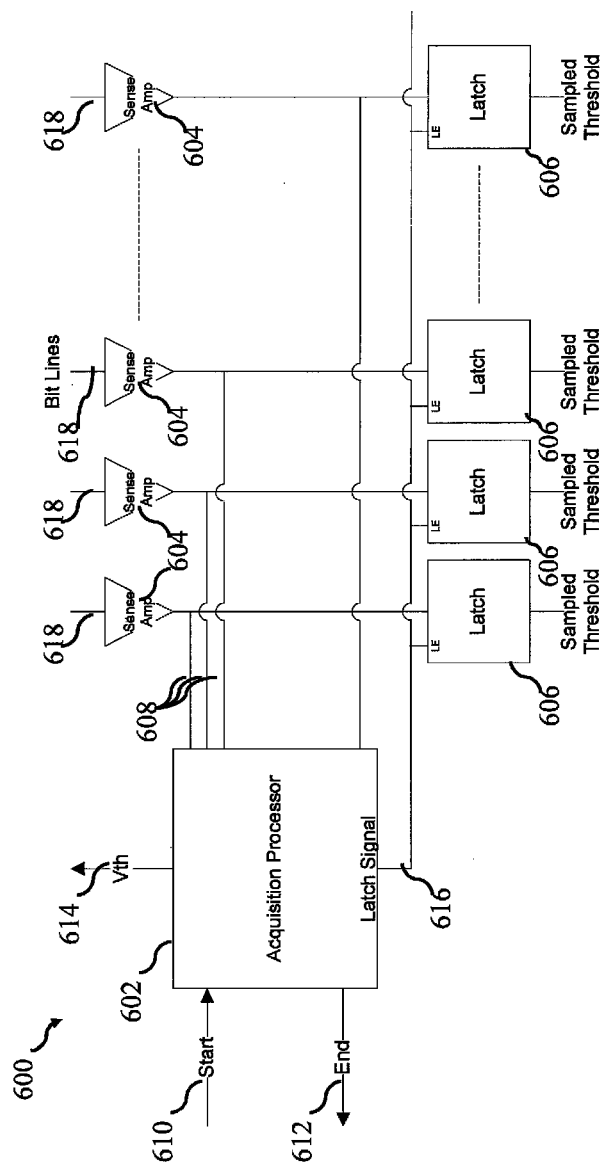
FIG. 6 schematically illustrates a memory device including an internal processor for adjusting read threshold voltages, according to an embodiment of the invention.

Reference is made to FIG. 6, which schematically illustrates a memory device 600 including an internal processor 602 for adjusting read threshold voltages, according to an embodiment of the invention.

Processor 602 may be positioned between one or more sense amplifiers 604 and one or more latches 606, for example, acting as a filter allowing only valid read results to pass from sense amplifiers 604 to latches 606. Processor 602 may input the read results that are output from sense amplifiers 604 and, for example, using a scoring mechanism, may determine the quality of the read results. In one example, scores in a first score range may have sufficient quality and scores in a second score range may have insufficient quality. Read results with sufficient quality may pass to latches 606 for storage, while read results with insufficient quality may not. Instead, cells read with insufficient quality may be re-read using adjusted read thresholds. Processor 602 may iteratively repeat the read threshold adjustment for reading each cell or bit line of memory cells 618 until read results with sufficient quality are detected and stored at latches 606.

Processor 602 may receive the following inputs (other input may be received):

1. Sense amplifier output results 608. In some embodiments, processor 602 may receive output or results from only a subset or small percentage of sense amplifiers 604 (e.g., 5-10%).

2. A start sampling signal 610 may command an internal state machine in the processor to begin sampling.

Processor 602 may provide the following outputs (other outputs may be provided):

1. An end sampling signal 612 may indicates that the sampling process has completed and that optimal read results are available at latches 606 (an additional line may be used to stop the sampling operation).

2. A sampling threshold Vth value 614 may inform the memory array of the value of read threshold, Vth, to use.

3. A latch enable strobe signal 616, which when pulsed, may cause the latches 606 to lock the output of the respective sense amplifiers 604.

If processor 602 determines read results of sense amplifier output results 608 have sufficient quality, processor 602 may output latch enable strobe signal 616, which may trigger latches 606 to latch the read results of sense amplifiers 604 for storage. However, if processor 602 determines that read results are have insufficient quality, processor 602 may not output latch enable strobe signal 616 (e.g., discarding the read results obtained using the initial sampling threshold), and may instead output adjusted threshold Vth value 614 adjusted from the initial sampling threshold for re-sampling the same cells at the adjusted threshold.

Processor 602 may intercept all sub-optimal read results with insufficient quality and may increment or adjust the read thresholds iteratively until a sampling condition is satisfied, such as, for example, read results are generated with sufficient quality, a maximum number of adjustments are made, or the improvement or change in scores between read results of consecutive iterations is sufficiently small or negative. By integrating the threshold adjustment mechanism of processor 602 within the read circuitry of memory device 600, the threshold adjustment may be executed on-the-fly, as part of each read operation, thereby minimizing conventional computations associated with executing a separate external threshold adjustment mechanism.

Figure 7:
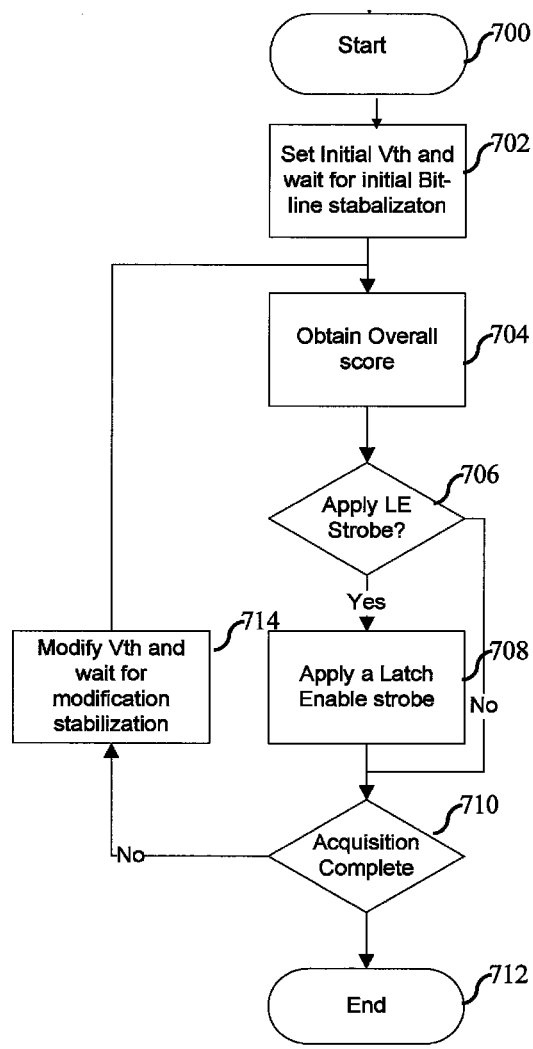
FIG. 7 is a flowchart of a method for adjusting read threshold voltages, according to an embodiment of the invention.

Reference is made to FIG. 7, which is a flowchart of a method 700 for adjusting read threshold voltages, according to an embodiment of the invention.

In operation 700, a processor (e.g., processor 602 of FIG. 6) may start a process to read memory cells (memory cells 618 of FIG. 6) after receiving a start signal (e.g., start sampling signal 610 of FIG. 6).

In operation 702, the processor may set an initial sampling threshold voltage value, Vth, which may trigger the memory array device to sample cells at that voltage. The processor may wait for a time delay to lapse, for example, estimated to be sufficient for the voltages of the cells to substantially stabilize (e.g., 10-50 μS), before reading the cell conductance. Sense amplifiers (e.g., sense amplifiers 604 of FIG. 6) may measure the cell conductance to determine the read results at the initial sampling threshold voltage value, Vth, and may transfer the read results to the processor.

In operation 704, the processor may calculate an overall score for the read results, for example, based on the output of some or all of the sense amplifiers. The overall score may measure the quality of the results.

In operation 706, the processor may determine whether or not to store or latch the results of the sense amplifiers, for example, based on the overall score calculated for the results. In one embodiment, the processor may store the read results, for example, if the threshold voltage set in operation 702 is the first threshold set for the current read operation, if the overall score calculated for the read results in operation 704 is the lowest overall score calculated so far, and/or if the overall score calculated for the read results in operation 704 is below a predetermined threshold. If the processor determines to store the results, a process or processor may proceed to operation 708. Otherwise, a process or processor may proceed to operation 710.

In operation 708, the processor may send a latch enable strobe signal (e.g., latch enable strobe signal 616 of FIG. 6) to store the outputs of the sense amplifiers in a latch or memory (e.g., latches 606 of FIG. 6).

In operation 710, the processor may determine if the acquisition process for sampling or reading the cells is complete. The reading process may complete if the read results satisfy one or more sampling conditions, such as, if the number iterations reaches a predetermined maximum number, if the improvement read results of consecutive iterations is sufficient small or decreasing, and/or if a quality measure is within a predetermined optimal range. If so, a process or processor may proceed to operation 712, generating an end signal (e.g., end sampling signal 612 of FIG. 6) to end sampling. Otherwise, a process or processor may proceed to operation 714.

In operation 714, the processor may modify or adjust the sampling threshold voltage value, Vth. The change in voltage from the previous to the current adjusted threshold, Vth, may be based on the overall score calculated in operation 704 and/or previous values of the Vth read result or, may be a constant value incremented for each sampling iteration. The adjusted threshold voltage, Vth, may be used to sample (the same) cells at a new voltage value (e.g., adjusted threshold value 614 of FIG. 6). The processor may wait for the voltage across the memory cells to stabilize. In some cases, the duration for the voltage to stabilize may decrease following the initial threshold setting since the change in voltage from the initial to the current adjusted threshold is generally considerably smaller and the cells have already been charged. The sense amplifiers may obtain the read results for the adjusted sampling threshold voltage value, Vth, and may transfer the read results to the processor.

A process or processor may iteratively repeat operations 704-712 or 714 for each new adjusted sampling threshold, for example, until the processor determines that the acquisition process is complete in operations 710.

Other operations or orders of operations may be used.

Figure 8:
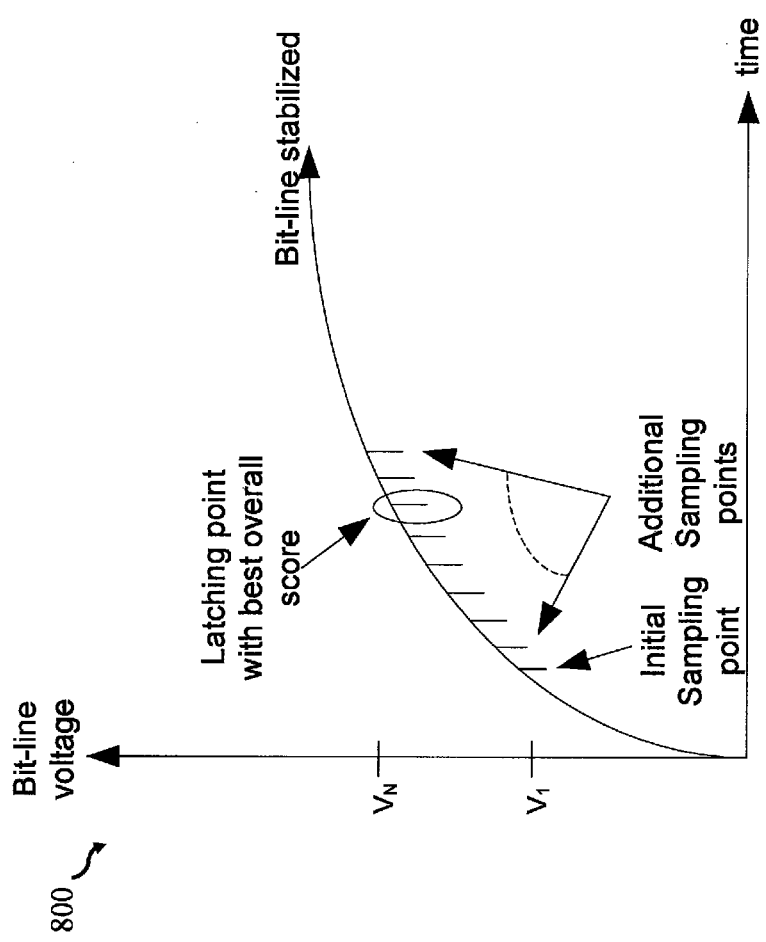
FIG. 8 is a graph illustrating iterative sampling of memory cells as the cell voltage stabilizes over time, according to an embodiment of the invention.

In some embodiments of the invention, instead of using a relatively small stabilizing time and waiting for the cell voltage to stabilize in each iteration (e.g., as described in reference to FIG. 7), the processor may use a relatively long stabilizing time to freely sample with each adjusted thresholds without waiting (e.g., as described in reference to FIG. 8). In some embodiment, after the processor sets the initial threshold voltage value, Vth, the processor may not wait for the cell voltage to stabilize, but may continually sample the memory cells with each adjusted threshold value while the voltage stabilizes towards its final state and occasionally, when a read result is estimated to have sufficient quality, the processor may store the sense amplifiers results into the latches. For example, a bit line may be charged and allowed do discharge when a reference voltage is applied to the Flash transistor. Sampling the bit line at different times may be equivalent to sampling at different Vth voltages (within some range). Alternatively, the bit line may be charged, and the time it takes to charge may depend on the value of the voltage threshold, Vth, applied to the target cell and the charge in the cell.

Reference is made to FIG. 8, which is a graph 800 illustrating the iterative sampling of memory cells as the cell voltage stabilizes over time, according to an embodiment of the invention. The y-axis of the graph may represent an absolute or scaled voltage across a bit-line of memory cells and the x-axis may represent time. When current is applied to the memory cells, the voltage of the memory cells may not immediately reach a substantially accurate or stabilized value, but may instead asymptotically approach that stable value. In some embodiments, the bit line may be iteratively sampled during the time delay until the stable voltage value is reached. During this time delay, the processor may initiate sampling using an initial threshold voltage value, V1, and then may sample again as the actual bit-line voltage changes over time to adjusted threshold voltage values, V2, V3, . . . , until a final adjusted threshold voltage value, VN, is estimated to have sufficient quality, and the iterative threshold adjustment may end.

Figure 9:
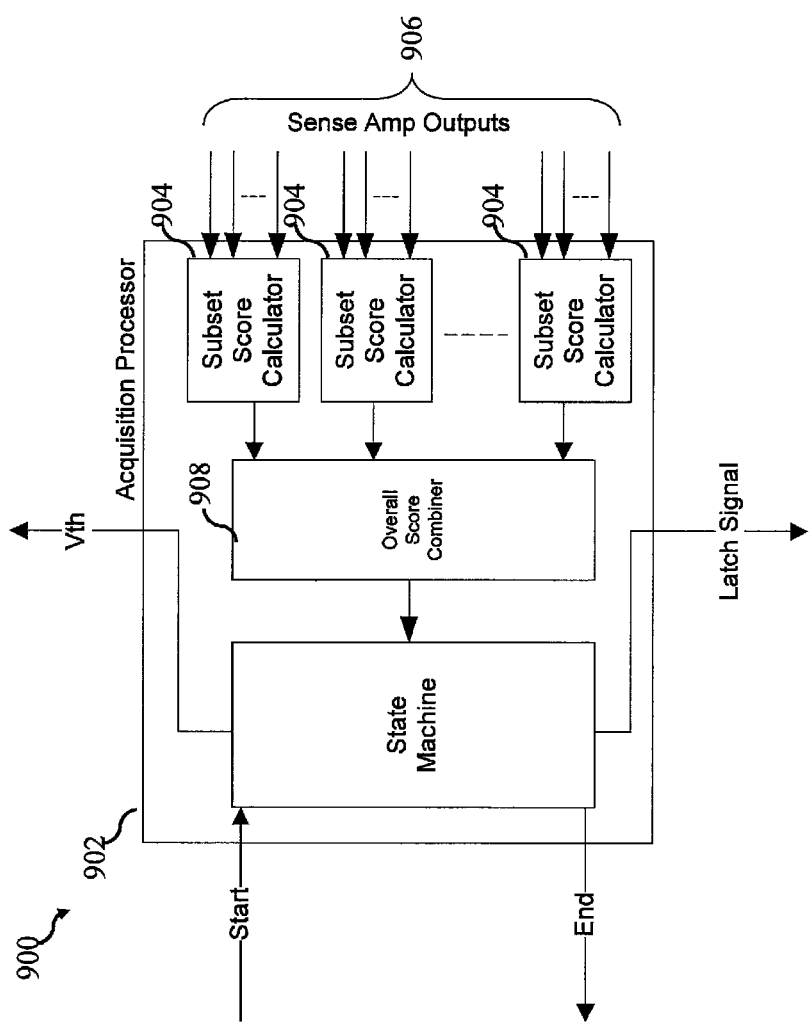
FIG. 9 schematically illustrates a memory device including an internal processor for adjusting read threshold voltage values, according to an embodiment of the invention.

Reference is made to FIG. 9, which schematically illustrates a memory device 900 including an internal processor 902 for adjusting read threshold voltage values, according to an embodiment of the invention.

Processor 902 (e.g., processor 602 of FIG. 6) may include an overall score generator 908 to calculate an overall score for the read results of each sampling iteration and corresponding threshold voltage. In one embodiment, to reduce complexity of the overall score calculation, processor 902 may include a plurality of subset score calculators 904 to divide the overall score calculation into a plurality of steps. Each subset score calculator 904 may calculate the score obtained from a different subset of sense amplifier outputs 906 for a different subset of memory cells (e.g., each individual bit line). Overall score generator 908 may then combine the subset scores calculated by each subset score calculators 904 to generate an overall score for sampling the entire set of memory cells (e.g., the entire data block) with the corresponding threshold voltage.

The overall score may be calculated, for example, according to any one or more of the following calculations (other calculations may be used):

1. Processor 902 may count the number of "1"s output by sense amplifiers. The overall score may measure the difference between the number of counted "1"s and an average expected number. For example, the overall score may be a negative logarithm, (−log), function of n choose k, $$\binom{n}{k},$$

where k is the number of "1"s and n is the number of sense amplifier outputs received by processor 902 and where $$\binom{n}{k} = \frac{n!}{(n-k)!k!},$$

where "!" defines a factorial operator. If the average expected numbers of "1"s and "0"s at an optimal threshold, Vth, are not equal, but instead there is, for example, a probability p for a number to be a "1" (as may be the case when sampling different thresholds of an MLC device), then the overall score may be calculated, for example, as $$-\log\binom{n}{k} - k*\log(p) - (n-k)*\log(1-p).$$

2. Processor 902 may use the number of "1"s calculated in (1) for a current and a previous threshold voltage values, Vth, to calculate the number of "1"s within a bin bounded by the two threshold voltage values. Processor 902 may use this score to search for a minimum probability distribution value between two lobes bounding the bin. The overall score may measure the difference between the current threshold voltage value read results and the previous threshold voltage value read results.

3. Processor 902 may generate redundant cells in each page, which may be programmed with predetermined information and the number of "1"s may be counted in those cells. A good score may be given if the number of "1"s is close to the expected number programmed into the cells.

4. Processor 902 may generate error correction redundancy cells (e.g., error correction code (ECC)), for example, for each subset of sense amplifier outputs. The error correction redundancy cells may be generated "on the fly," for example, during cell programming as the data is sequentially streamed into the memory device 900. During the sampling process, each subset score calculator 904 may decode the received ECC data and may generate a score based on the number of errors detected. Overall score generator 908 may sum all the scores from each subset score calculator 904 to generate the overall score. In general, the larger the overall score, the more errors are detected and the farther the sampling threshold voltage value is from an ideal sampling voltage value. The voltage step for adjusting the sampling threshold voltage value, Vth, may be determined based on the number of errors detected and/or the type of error detected (e.g., '1' to '0' or '0' to '1'). In some cases, error correction or detection redundancy cells may use less redundancy data to achieve the same or better sampling accuracy than redundancy cells storing other information.

5. Processor 902 may generate error detection redundancy cells (e.g., cyclic redundancy check (CRC)). Such embodiments may use error detection, but not error correction, properties of the code. The overall score may be a function of the number of subsets in which errors where detected.

6. Processor 902 may generate acquisition code redundancy cells. An acquisition code may provide a score based on the severity of errors. In one example, acquisition code may include modulo code, for example, which adds (L−1) redundancy bits that ensure the number of "1"s, for example, in each subset of sense amplifier outputs, is equal to 0 modulo L. The modulo code may add (L−(number of "1"s in original subset modulo L)) "1"s to the redundancy data. Each subset score calculator 904 may calculate a subset score, for example, as x if $$x \le \frac{L}{2} \text{ or } x - L \text{ if } x > \frac{L}{2},$$

where x=number of "1"s in each subset of sense amplifier outputs including redundancy modulo L. The overall score may be the absolute value of the sum of all subset scores or, alternatively, the sum of the absolute values of the subset scores.

7. Processor 902 may generate redundancy cells that include an ECC codeword that encodes the number of "1"s modulo L in each subset of sense amplifier outputs. The ECC codeword may be generated such that the codeword is decodable, even for poorly positioned thresholds. Processor 902 may decode the ECC codeword to determine the number of "1"s modulo L in each subset of sense amplifier outputs. Subset scores may be assigned comparing the number of "1"s modulo L counted in the read results and decoded in the ECC codeword. Each subset score may measure the difference between the decoded number of "1"s and an expected number programmed into the ECC codeword. Overall score generator 908 may combine the subset scores to generate the overall score, for example, as the absolute value of the sum of all subset scores or, alternatively, the sum of the absolute values of the subset scores.

8. Processor 902 may generate redundancy cells that include an ECC codeword that encodes the overall number of "1"s in all the sense amplifier outputs. The ECC codeword may be generated such that the codeword is decodable, even for poorly positioned thresholds. The overall score may measure the difference between the decoded overall number of "1"s and an expected number programmed into the redundancy cells.

9. The overall score may measure the quality of the thresholds. Processor 902 may count the number of cells on the verge of conductance, i.e., the number of cells expected to conduct if sampled at a given threshold value, Vth. Memory device 900 may perform a first and second reads using the threshold value. The results of the two reads may be XORred. The overall score may be the number of ones in the XORred results, which may indicate the number of cells which are unstable at that threshold. For example, if the value of a cell is '0' with a probability 0.5 in the PDF and the number of unstable cells is low, only few cells may be detected in that region, and the given threshold value Vth may be recommended. In general, the larger the overall score, the greater the number of unstable cells and the farther the given threshold, Vth, is from an ideal sampling voltage value. To more precisely determine the number of unstable cells, memory device 900 may perform additional reads, XOR the results, and count the total count of unstable cells. To reduce the number of XOR operations, results may be XORed for only a subset of selected cells. By counting the number of bits which are flipped from '1' to '0' and vice versa (or the difference between these two measures), processor 902 may determine whether to increase or decrease the given threshold value, Vth. For example, if there are more zero to one flips than one to zero flips, threshold value, Vth, may be adjusted in the direction which increases the number on ones. Accordingly, the score may be signed, having a magnitude and direction for adjusting the threshold value, Vth. If the probability that a cell is '0' is not half in the PDF, the score value may be weighted according to the empirical probability that the cell is '1' and '0'. If the lobe distributions in the PDF are not even, this asymmetry may contribute to the score, for example, as a weighing factor. For example, for the score generated in (6) above, each subset score may be multiplied by one of two positive scalars, depending on the sign of the original subset score.

Embodiments of the invention may use any single or combination of multiple overall score calculations described in (1)-(9). For example, the overall score may be a function of the combined scores generated in (1) and (6).

Although some embodiments of the invention describe mechanisms for sampling cells using a single threshold, such embodiments may be extended to sampling cells using multiple thresholds, for example, to read and decode upper bits in a multi-level cell memory (e.g., any non-MSB, such as, CSB or LSB). For example, to read an LSB in a 2 bpc memory device, two thresholds may be sampled (e.g., thresholds 311 and 313 of FIG. 3) and their results may be combined. To combine the results of sampling with multiple separate threshold detection, the following may be considered:

1. Threshold results combining: Each threshold may be detected separately. In one embodiment, the lower voltage threshold (e.g., threshold 311 in FIG. 3) may be detected first and the higher voltage threshold (e.g., threshold 313 in FIG. 3) may be detected second. In such embodiments, the adjustable threshold, Vth, value may initially be set at a relatively high voltage value and may be adjusted by incrementally decreasing the voltage by a voltage step for each additional sampling (both for lower and higher thresholds). The results of the first threshold detection may be stored in a set of latches, for example, as "1" if the cell is not charged and "0" if the cell is charged. To reuse the same set of latches for the second threshold detection, whenever the sense amplifier outputs are latched, a value such as the latch output logical OR the inverse of sense amplifier output may be stored. In another embodiment, the higher voltage threshold (e.g., threshold 313 in FIG. 3) may be detected first and the lower voltage threshold (e.g., threshold 311 in FIG. 3) may be detected second, where the adjustable threshold, Vth, value may be initially set at a relatively low voltage value and adjusted by increasing the voltage for each additional sampling.

2. When coding multi-threshold bits, redundancy cells may be generated for each of the multiple thresholds used to read each upper bit page. During programming, the MSB is typically read first. The redundancy cells may be generated, not based on the input stream of the LSB, but as a function of MSB and LSB. For example, to generate redundancy data for the lower threshold, a logical function may be applied to input data for the encoder, such as, MSB value logical AND LSB value. To generate redundancy data for the higher threshold, a logical function, such as, inverse MSB value logical OR inverse LSB value, may be used.

It will be clear to a person who is of skill in the art that similar methods also exist for devices implementing a different number of bit per cell, such as 3 and 4 bits per cell devices.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the true spirit of the invention.

We claim:

1. A method for adjusting read threshold voltage values, comprising: estimating, by a processor of a read circuit of a memory device that comprises memory cells, a quality of a read result; allowing only read results estimated to have sufficient quality to pass from sense amplifiers of the read circuit to be stored in latches of the memory device and then to be provided to an external controller coupled to the memory device; and adjusting a read threshold voltage value for subsequent read operations if the read result is estimated to have insufficient quality.

2. The method of claim 1 comprising iteratively adjusting the read threshold voltage value until a read result is estimated to have sufficient quality.

3. The method of claim 2, wherein a read result is estimated to have sufficient quality if a quality measure is within a predetermined optimal range or if a quality measure is the most optimal measured from among the previous iterations.

4. The method of claim 2 comprising ending iteratively adjusting the read threshold voltage value when a number of iterations reaches a predetermined maximum number, if the improvement read results of consecutive iterations is sufficient small or decreasing, or if a quality measure is within a predetermined optimal range.

5. The method of claim 1 wherein the read threshold voltage value is adjusted by a voltage step, wherein a size of the voltage step is based on the estimated quality of the read result or previous read threshold voltage values.

6. The method of claim 1 wherein the read threshold voltage value is adjusted by a constant voltage step for each adjustment.

7. The method of claim 1 wherein the read threshold voltage value is adjusted on-the-fly as part of each read operation.

8. The method of claim 1 comprising, in the internal read circuit, selectively filtering read results to allow only read results estimated to have sufficient quality to pass to storage.

9. The method of claim 1 comprising waiting for a time delay to lapse for the cell voltage to stabilize before measuring the read results at each adjusted read threshold voltage value.

10. The method of claim 1 comprising sampling multiple read threshold voltage values before the cell voltage stabilizes.

11. The method of claim 1 comprising sequentially adjusting each of multiple thresholds to determine read results for a multi-threshold bit decision.

12. The method of claim 1 comprising adjusting multiple thresholds in parallel to determine read results for a multi-threshold bit decision.

13. The method of claim 1, wherein the quality of a read result is measured by a score.

14. The method of claim 1 wherein the quality of a read result is measured based on a factor selected from a group consisting of: a difference between a number of "1"s counted in the read results and an average expected number or an expected number programmed in redundancy cells or error correction code, the number of "1"s in a certain bin, a number of errors, bit lines containing errors and/or type of errors detected using redundancy cells or cyclic redundancy check (CRC) codes, the severity of errors detected using redundancy cells, the severity of errors detected using modulo codes, and a number of cells which are unstable at the sampled threshold voltage value.

15. The method of claim 1, wherein the quality of the read result for the read threshold voltage value is estimated separately for read results of each of a plurality of different subsets of the memory cells, which are combined to generate an overall estimate of the quality of the read result for the complete set of memory cells.

16. The method of claim 15 comprising estimating the read results for a plurality of different subsets of memory cells in parallel.

17. A system for adjusting read threshold voltage values, comprising: a memory device comprising memory cells; and an read circuit internal to the memory device, wherein for each read threshold voltage value used to read memory cells, a processor of the read circuit estimates a quality of a read result, allows only read results estimated to have sufficient quality to pass from sense amplifiers of the read circuit to be stored in latches of the memory device and then to be provided to an external controller coupled to the memory device, and adjusts the read threshold voltage value for subsequent read operations if the associated read result is estimated to have insufficient quality.

18. The system of claim 17, wherein the internal read circuit iteratively adjusts the read threshold voltage value until a read result is estimated to have sufficient quality.

19. The system of claim 18, wherein the internal read circuit estimates that a read result has sufficient quality if a quality measure is within a predetermined optimal range or if a quality measure is the most optimal measured from among the previous iterations.

20. The system of claim 18, wherein the internal read circuit ends iteratively adjusting the read threshold voltage value when a number iterations reaches a predetermined maximum number, if the improvement read results of consecutive iterations is sufficient small or decreasing, or if a quality measure is within a predetermined optimal range.

21. The system of claim 17, wherein the internal read circuit adjusts the read threshold voltage value by a voltage step, a size of the voltage step is based on the estimated quality of the associated read result or previous read threshold voltage values.

22. The system of claim 17, wherein the internal read circuit adjusts the read threshold voltage value by a constant voltage step for each adjustment.

23. The system of claim 17, wherein the internal read circuit adjusts the read threshold voltage value on-the-fly as part of each read operation.

24. The system of claim 17 comprising a processor or controller in the internal read circuit positioned in between one or more sense amplifiers and one or more latches to selectively filter read results output from the sense amplifiers to allow only read results estimated to have sufficient quality to pass to the latches for storage.

25. The system of claim 17, wherein the internal read circuit waits for a time delay to lapse for the cell voltage to stabilize before measuring the read results at each adjusted read threshold voltage value.

26. The system of claim 17, wherein the internal read circuit samples multiple read threshold voltage values before the cell voltage stabilizes.

27. The system of claim 17, wherein the internal read circuit sequentially adjusts each of multiple thresholds to determine read results for a multi-threshold bit decision.

28. The system of claim 17, wherein the internal read circuit adjusts multiple thresholds in parallel to determine read results for a multi-threshold bit decision.

29. The system of claim 17, wherein the internal read circuit measures the quality of a read result by a score.

30. The system of claim 17, wherein the internal read circuit measures the quality of a read result based on a factor selected from a group consisting of: a difference between a number of "1"s counted in the read results and an average expected number or an expected number programmed in redundancy cells or error correction code, the number of "1"s in a certain bin, a number of errors, bit lines containing errors and/or type of errors detected using redundancy cells or cyclic redundancy check (CRC) codes, the severity of errors detected using redundancy cells, the severity of errors detected using modulo codes, and a number of cells which are unstable at the sampled threshold voltage value.

31. The system of claim 17, wherein the internal read circuit estimates the quality of the read result for the read threshold voltage value separately for read results of each of a plurality of different subsets of the memory cells and combines the separate estimates to generate an overall estimate of the quality of the read result for the complete set of memory cells.

32. The system of claim 31, wherein the internal read circuit estimates the read results for a plurality of different subsets of memory cells in parallel.

33. The method according to claim 1, comprising estimating quality of read results associated with multiple sense amplifiers by processing output signals provided from a subset of the multiple sense amplifiers.

34. The method according to claim 1, comprising estimating quality of read results associated with multiple sense amplifiers by processing output signals provided from between 5% and 10% of the multiple sense amplifiers.

35. The method of claim 1 wherein the quality of a read result is measured based on a severity of errors detected using modulo codes.

36. The method of claim 1 wherein the quality of a read result is measured based on a severity of errors detected using redundancy cells.

37. The method of claim 1 wherein the quality of a read result is measured based on a number of cells which are on verge of conductance at the sampled threshold voltage value.

38. The system of claim 17, wherein the internal read circuit estimates quality of read results associated with multiple sense amplifiers by processing output signals provided from a subset of the multiple sense amplifiers.

39. The system of claim 17, wherein the internal read circuit estimates quality of read results associated with multiple sense amplifiers by processing output signals provided from between 5% and 10% of the multiple sense amplifiers.

40. The system of claim 17 wherein the quality of a read result is measured based on a severity of errors detected using modulo codes.

41. The system of claim 17 wherein the quality of a read result is measured based on a severity of errors detected using redundancy cells.

42. The system of claim 17 wherein the quality of a read result is measured based on a number of cells which are on verge of conductance at the sampled threshold voltage value.

* * * * *